United States Patent [19]

Makino et al.

[11] Patent Number: 4,485,234

[45] Date of Patent: Nov. 27, 1984

[54] METHOD OF PREPARING POLYAMIDE ACID FOR PROCESSING OF SEMICONDUCTORS

[75] Inventors: Daisuke Makino, Hitachi; Yasuo Miyadera, Shimodate, both of Japan

[73] Assignee: Hitachi Chemical Company, Ltd., Tokyo, Japan

[21] Appl. No.: 580,520

[22] Filed: Feb. 15, 1984

Related U.S. Application Data

[60] Division of Ser. No. 307,199, Sep. 30, 1981, Pat. No. 4,447,596, which is a continuation of Ser. No. 54,429, Jul. 3, 1979, abandoned.

[30] Foreign Application Priority Data

Jul. 11, 1978 [JP] Japan .................................. 53-84295

[51] Int. Cl.$^3$ ................................................ C08G 73/10
[52] U.S. Cl. ..................................... 528/329; 528/125; 528/184; 528/185; 528/229; 528/310; 528/321; 528/331; 528/353; 525/436

[58] Field of Search ............... 528/329, 331, 125, 184, 528/185, 310, 327, 353, 229, 321; 525/436

[56] References Cited

U.S. PATENT DOCUMENTS

4,447,596 5/1984 Makino et al. ...................... 528/331

*Primary Examiner*—Harold D. Anderson
*Attorney, Agent, or Firm*—Frishauf, Holtz, Goodman & Woodward

[57] ABSTRACT

An improved method of preparing polyamide acid for processing of semiconductors from a diamine and a tetracarboxylic acid dianhydride with a diaminocarbonamide, is provided (1) by reacting the components at below 40° C. until the reduced viscosity reaches above 0.5 dl/g. at 30° C., and then, (2) by adjusting the reduced viscosity to more than 0.3 dl/g, at 30°0 C. and the solution viscosity to 500–3,000 cps at 25° C. by heating at 50°–100° C. By applying the polyamide acid obtained by the method to semiconductor apparatus, they get sufficient heat-resistance without pin holes, and their reliability may be greatly improved.

7 Claims, No Drawings

METHOD OF PREPARING POLYAMIDE ACID FOR PROCESSING OF SEMICONDUCTORS

This is a division of application Ser. No. 307,199 filed Sept. 30, 1981, now U.S. Pat. No. 4,447,596 which in turn is a continuation of Ser. No. 54,429, filed July 3, 1979, now abandoned.

BACKGROUND OF THE INVENTION

The invention relates to a method of preparing a polyamide acid, used for processing of semiconductors, obtained from a diamine and a tetracarboxylic acid dianhydride, optionally with a diaminocarbonamide compound.

More particularly, it is to provide a polyamide acid for processing of semiconductors capable of transforming into a polyimide resin, having imide rings and/or benzoylenequinazolone rings, useful as insulating films for semiconductors such as a surface-protecting film of semiconductors or layer-insulating film of semiconductors having multi-layer construction.

Heretofore, silicon dioxide films which were formed by the chemical gas-phase growing method have mainly been employed as insulating films for semiconductors, such as surface-protecting films of semiconductors or layer-insulating films of wired conductors having multi-layer wiring construction.

However, silicon dioxide films have defects. There is a tendency to crack due to stress of films if they are thick in size or if they are used for layer-insulating films of a wired conductor having more than three layers. Snapping of wired conductors also tends to occur due to their poor step coverage.

These defects have prevented improvements in efficiency and integration of semiconductors.

In order to overcome these defects, there have been recently employed, as insulating films, organic materials, particularly polyimide group resins having imide rings and/or benzoylenequinazolone rings obtained by heating and dehydrating a polyamide acid synthesized from a diamine and a tetracarboxylic acid dianhydride optionally with a diaminocarbonamide. Such films have superior heat-resistance.

By using the materials, the defects of silicon dioxide films such as occurrence of cracks and poor step coverage have been avoided, and thus novel semiconductor apparatus have been invented as disclosed in Japanese patent publications Nos. 51-44871/1976 and 51-31185/1976 and the respective corresponding U.S. Pat. No. 3,846,166 and No. 4,017,886.

The above-mentioned insulating film of a polyimide group resin having imide rings and/or benzoylenequinazolone rings may be formed by preparing a polyamide acid from a diamine and a tetracarboxylic acid dianhydride optionally with a diaminocarbonamide, then making a solution of the thus obtained polyamide acid with an inert solvent, thereafter coating the solution on a wafer with a photoresist rotatory coating machine, and finally heating the coated wafer.

The insulating film must be formed uniformly with a thickness of below 5 μM and within the range of ±0.2 μM scattering, and without any pin holes caused by runaway (repelling) of coated film from viewpoint of the capabilities of semiconductors.

It must also have heat-resistance enough for withstanding heat-processing applied during production of semiconductors, such as wire bonding and contact alloy processing between electrodes.

However, there have taken place such problems in the course of trial manufacture of many semiconductors, in which the above-mentioned polyamide acid was used, that a uniform film with sufficient thickness could not be formed. Pin holes due to runaway of coated film developed and the desired heat-resistance could not be obtained.

BRIEF SUMMARY OF THE INVENTION

It is, therefore, an object of the invention to provide a polyamide acid for processing semiconductors capable of transforming into a polyimide resin having imide rings and/or benzoylenequinazolone rings useful as insulating films for semiconductors such as surface-protecting film of semiconductors or layer-insulating film of semiconductors having multi-layer construction that does not have the above-mentioned defects.

The inventors have found that the object may be attained by controlling the manufacturing process of the polyamide acid obtained from a diamine and a tetracarboxylic acid dianhydride optionally with a diaminocarbonamide, as well as concentration of the polyamide acid in the solution and the viscosity of the solution.

Heretofore, cyclized rubber series photoresists have been known as examples of forming thin films of less than 5 μM thick without pin holes on a wafer, with high accuracy, by the rotatory coating method.

It has become possible to form a uniform resin film having a superior heat-resistance by rotatory-coating, on a wafer, using the polyamide acid obtained by the method of the invention.

The method of the invention comprises firstly reacting a diamine and a tetracarboxylic acid dianhydride optionally with a diaminocarbonamide, in an inert solvent at below 40° C. for 30 minutes to 24 hours, until the reduced viscosity at 30° C. reaches above 0.5 dl/g. Preferably above 0.7 dl/g., and secondly adjusting the reduced viscosity to more than 0.3 dl/g. preferably 0.35 to 0.45 dl/g., and the viscosity at 25° C. of the solution to 500–3,000 centipoise (cps) preferably 800–1500 cps by heating at 50°–100° C. for 30 minutes to 24 hours.

DETAILED DESCRIPTION OF THE INVENTION

The polyamide acid obtained by the method of the invention is a copolymer represented by the formulae:

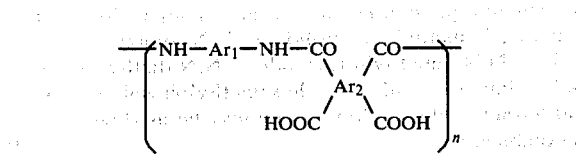

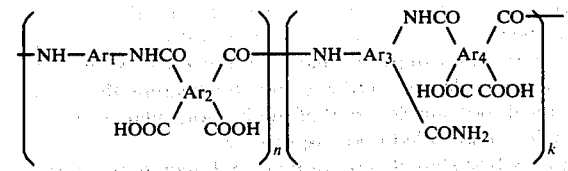

(wherein, $Ar_1$, $Ar_2$, $Ar_3$ and $Ar_4$ each represent an aromatic residue and m, n and k each represent as integer) which, in turn, is transformed by dehydration and cyclization into a polyimide group resin containing a group represented by the formulae:

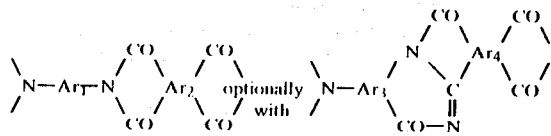

(wherein, Ar₁, Ar₂, Ar₃ and Ar₄ each represent an aromatic residue).

The diamines to be employed in the invention include, for example, 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine and 2,6-naphthalenediamine. They may be used alone or in combination.

The tetracarboxylic acid dianhydride include, for example, pyromellitic acid dianhydride, 3,3', 4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride and 4,4'-sulfonyldiphthalic acid dianhydride. They may be used alone or in combination.

The diaminocarbonamide compounds include, for example, 4,4'-diaminodiphenyl ether-3-carbonamide, 3,4'-diaminodiphenyl ether-4-carbonamide, 3,4,'-diaminodiphenyl ether-3'-carbonamide, 3,3'-diaminodiphenyl ether-4-carbonamide, 4,4'-diaminodiphenylmethane-3-carbonamide, 3,4'-diaminodiphenylmethane-4-carbonamide, 3,4'-diaminodiphenylmethane-3'-carbonamide, 3,3'-diaminodiphenylmethane-4-carbonamide, 4,4'-diaminodiphenyl sulfone-3-carbonamide, 3,4'-diaminodiphenyl sulfone-4-carbonamide, 3,4'-diaminodiphenyl sulfone-3'-carbonamide, 3,3'-diaminodiphenyl sulfone-4-carbonamide, 4,4'-diaminodiphenyl sulfide-3-carbonamide, 3,4'-diaminodiphenyl sulfide-4-carbonamide, 3,3'-diaminodiphenyl sulfide-4-carbonamide, 3,4'-diaminodiphenyl sulfide-3'-carbonamide and 1,4-diaminobenzene-2-carbonamide. They may be used alone or in combination.

In preparing the polyamide acid from the abovementioned compounds, an inert organic solvent is used. Particularly preferable are those which dissolve the polyamide type intermediate formed. They include, for example, N-methyl-2-pyrrolidone, N,N-dimethylacetamide, N,N-dimethylformamide, N,N-diethylformamide, dimethyl sulfoxide, hexamethylphosphoramide and tetramethylenesulfone. They may be used alone or in combination.

The preparation of polyamide acid according to the invention comprises two steps, namely the first step to synthesize a polyamide acid of high molecular weight, and the second step to reduce the molecular weight to the desired degree and viscosity by heating the thus obtained polyamide acid of high molecular weight, which is a so-called cooking process.

In the first step, it is required to polymerize the polyamide acid to the extent that the reduced viscosity at 30° C. reaches more than 0.5 dl/g. An insufficient polymerization of polyamide acid may cause an insufficient heat-resistance of the cured film finally obtained, an insufficient extent of second step (cooking process) to reduce the molecular weight to obtain the aimed viscosity, or runaway of coated film due to short period for the second step.

The second step, or cooking process, is performed in order to reduce the viscosity of the polyamide acid solution obtained in the first step and having a high viscosity to an extent that the solution may be rotatory coated with a photoresist rotatory machine and to prevent the runaway of coated film by singledispersing molecular weight distribution of the polyamide acid. In the second step, the polyamide acid solution is adjusted to obtain the reduced viscosity of more than 0.3 dl/g. at 30° C. and polyamide acid solution viscosity of from 500 to 3,000 cps at 25° C.

In this invention, the above-mentioned figures must be maintained because the film may not sufficiently be polymerized by heating, and as a result, the heatresistance of the cured film is impaired, if the molecular weight of the polyamide acid is so reduced that the reduced viscosity becomes less than 0.3 dl/g. At that time, the viscosity of polyamide acid solution at 25° C. must be maintained at 500 to 3,000 cps because a film of more than 1μ thick may not be obtained by coating the solution on a wafer with a photoresist rotatory coating machine, if the viscosity is below 500 cps. On the contrary, the thickness of marginal part becomes greater than that of the central part even at a high rotating speed of the photoresist rotatory coating machine due to the high viscosity, and therefore, the yield of semiconductor becomes low, if the viscosity is above 3,000 cps.

In this invention, it is preferable that the concentration of polyamide acid ranges from 5 to 30% by weight. The thickness of cured film may not reach the desired value and the uniformity of coated film may not be attained for obtaining the desired thickness by reducing the rotating speed of the machine, if the concentration is below 5% by weight. On the contrary, if the concentration of polyamide acid is above 30% by weight and if the polymerization is so performed that the reduced viscosity is above 0.5 dl/g., the stirring efficiency is lowered due to the high viscosity and the synthesis becomes, in effect, impossible.

The preparation of polyamide acid according to the invention is performed, for instance, as follows.

In the first step, a diamine optionally with a diaminocarbonamide are dissolved in an inert solvent and a tetracarboxylic acid dianhydride is added. The mixture is stirred at below 40° C., preferably around or below room temperature. The reaction proceeds rapidly and the viscosity of the reaction system increases gradually, forming a polyamide acid of high molecular weight. It is preferable to minimize the free acid content in the tetracarboxylic acid dianhydride, for example, by recrystallizing it from acetic anhydride in order to obtain a polyamide acid having such a molecular weight that the reduced viscosity at 30° C. is above 0.5 dl/g.

The purification also attains removal of metal ions which give the polyamide acid bad electrical influence when it is used as an insulating film for a semiconductor. Similarly, it is preferable that the diamine and the diaminocarbonamide to be used are recrystallized from, for example, an alcohol group solvent to remove metal ions.

It is also preferable that the inert solvent to be used is purified by distillation to remove metal ion impurities and water.

The polyamide acid thus obtained having the reduced viscosity at 30° C. of above 0.5 dl/g. is adjusted in the second step to have the above-mentioned reduced viscosity and solution viscosity, by heating the reaction system at 50°-φ° C. and hydrolyzing the polyamide acid of high molecular weight with trace amount of water present in the reaction system, reducing the molecular weight.

In the preparation of polyamide acid from a diamine and a tetracarboxylic acid dianhydride optionally with a diaminocarbonamide, it is preferable that approximately equal molar amount of a tetracarboxylic acid dianhydride is used to the amount of diamine or to the total amount of diamine and diaminocarbonamide in order to obtain the best heat-resistance.

The measurement of reduced viscosity is briefly explained as follows. The polyamide acid solution is poured into ice-water, methanol or the like giving a precipitate, which is thoroughly triturated, separated by filtration and dried. The resulting powder is dissolved in an organic solvent, the concentration is adjusted and subjected to measurement with a Ubbelohde's viscometer.

The viscosity of polyamide acid solution may be measured by a conventional technique with, for example, a Brookfield type viscometer.

The process of forming a thin film by coating the polyamide acid, obtained by the method of the invention, on a semiconductor is briefly explained as follows. A wafer useful in many semiconductor apparatus is set in a photoresist rotatory machine, and the polyamide acid solution is dropped onto the wafer by appropriate equipment such as a squirt device. The wafer is then rotated to coat the polyamide acid solution uniformly on the entire surface of the wafer.

The number of rotations is preferably adjusted to 3,000–6,000 rpm. The wafer is then heat-processed at above 300° C. for about one hour to form a cured film on the wafer. It is preferable that the heatprocessing is performed by stepwise increasing the temperature from a low temperature, for example, about 100° C. to obtain a coated film with no pin holes and no residual distortion.

An applicational example of the polyamide acid obtained by the method of the invention as an layerinsulating film of an integrated circuit(IC) having a double layer wiring construction is briefly explained as follows. On a substrate having the first layer wiring formed, the polyamide acid solution is rotatory-coated and heated to form a cured film, according to the above-mentioned process.

Then, the cured film is etched selectively with a photoresist to form through holes(interlayer-connecting holes). On the substrate, aluminum as the second layer conductor metal is vacuum-deposited, and a wiring layer is formed by photoetching.

Another application of the polyamide acid obtained by the method of the invention to the surface-protecting film of transistors for the prevention of the penetration of contaminants is given as follows. A cured film is formed on a transistor substrate having an electrode, according to a similar method as described above. Then the cured film is removed only where bonding is applied, giving a transistor having a surface-coating film.

The invention is further explained by the following examples. The purified materials used in the examples were recrystallized as follows.

(1) Purification of 4,4'-diaminodiphenyl ether

In a 5 liter flask equipped with a reflux condenser, 220 g. of unpurified 4,4'-diaminodiphenyl ether and 2,840 g. of n-butanol were placed. The 4,4'-diaminodiphenyl ether was dissolved under reflux, 60 g. of active carbon was added and the mixture was filtered. The filtrate was allowed to stand at room temperature for 2 days and the precipitates were collected by filtration. The precipitates were dried under reduced pressure at 40° to 50° C. to yield the purified 4,4'-diaminodiphenyl ether.

(2) Purification of 4,4'-diaminodiphenyl ether-3-carbonamide

The purification was conducted in the same manner as in (1), by using 300 g. of unpurified 4,4'-diaminodiphenyl ether-3-carbonamide, 1,430 g. of ethanol and 1,800 g. of ion-exchanged water as solvents for recrystallization to give the purified 4,4'-diaminodiphenyl ether-3-carbonamide.

(3) Purification of p-phenylenediamine

The purification was conducted in the same manner as in (1), by using 200 g. of unpurified p-phenylenediamine, 2,560 g. of ethanol and 1,280 g. of ethyl ether as solvents for recrystallization to give the purified p-phenylenediamine.

(4) Purification of pyromellitic acid dianhydride and of 3,3',4,4'-benzophenonetetracarboxylic acid dianhydride.

In a 5 liter flask equipped with a reflux condenser, 600 g. of unpurified pyromellitic acid dianhydride and 3,560 g. of acetic anhydride were placed. The pyromellitic acid dianhydride was dissolved under reflux, 90 g. of active carbon was added and the mixture was filtered. The filtrate was allowed to stand at room temperature for 2 days and the precipitates were collected by filtration and dried at 150° C. for 2 days, giving the purified pyromellitic acid dianhydride.

The purification of 3,3'4,4'-benzophenonetetracarboxylic acid dianhydride was conducted under all the same conditions to yield the purified 3,3',4,4'-benzophenonetetracarboxylic acid dianhydride.

Concentrations of free acids in unpurified and purified pyromellitic acid dianhydride and of unpurified and purified 3,3',4,4'-benzophenonetetracarboxylic acid dianhydride were 24.57, 0.04, 0.86 and 0.00%, respectively.

EXAMPLE 1.

In a 300 ml. three-necked flask equipped with a thermometer, a stirrer and a calcium chloride tube, 7.29 g. (0.03 mol) of above-purified 4,4'-diaminodiphenyl ether-3-carbonamide, 6.0 g. (0.03 mol) of above-purified 4,4'-diaminodiphenyl ether and 149 g. of above-purified N,N-dimethylacetamide were placed and stirred thoroughly, while cooling the flask in an ice bath.

To the mixture, 13.08 g. (0.06 mol) of above-purified pyromellitic acid dianhydride was added little by little. Two hours after completion of the addition, the ice bath was removed and the whole mixture was stirred at room temperature for 5 hours to proceed with the reaction and complete the first step.

A portion of the reaction solution was taken out and the reduced viscosity and the solution viscosity of the polyamide acid were measured, which turned out to be 1.08 dl/g. (0.1 g./100 cc dimethylsulfoxide solution at 30° C., the measurement conditions being the same in hereinafter description ) and 45,100 cps (Brookfield type viscometer at 25° C., the measurement conditions being the same as hereinafter described), respectively.

The flask was then heated in a water bath to maintain the reaction system at 85° C., with stirring, to proceed with the second step (cooking process). The viscosity of the solution was, i.e., lowered, during the step.

1.5 Hours, 4.5 hours and 7 hours after the reaction system reached 85° C., 300 cc each of the reaction solution was taken out from the reaction system to obtain three kinds of polyamide acid solution A (cooking process, 1.5 hours), B (cooking process, 4.5 hours) and C (cooking process, 7 hours). The reduced viscosity and the solution viscosity of samples A, B and C were 0.74 dl/g., 2,560 cps; 0.50 dl/g., 1,040 cps; 0.41 dl/g. and 760 cps, respectively.

EXAMPLE 2.

To a flask similar to that used in Example 1, 4.37 g. (0.018 mol) of purified 4,4'-diaminodiphenyl ether-3-carbonamide, 4.54 g. (0.042 mol) of purified p-phenylenediamine and 254 g. of purified N-methyl-2-pyrrolidone were placed. The mixture was heated at 35° C. in a water bath to obtain a homogeneous solution. The water bath was removed and the flask was maintained at room temperature. 6.54 g. (0.03 mol) of pyromellitic acid dianhydride and 9.66 g. (0.03 mol) of 3,3',4,4'-benzophenonetetracarboxylic acid dianhydride were added little by little, and the whole mixture was stirred for 10 hours to proceed with the reaction and complete the first step. A portion of the reaction solution was taken out, and the reduced viscosity and the solution viscosity of the polyamide acid were measured according to the methods described in Example 1, which turned out to be 0.96 dl/g. and 5,920 cps, respectively.

The flask was then heated in a water bath to maintain the reaction system at 80° C., with stirring, to proceed with the second step (cooking process). The viscosity of the reaction solution was gradually reduced, i.e., lowered, during the step. 2 Hours and 6 hours after the reaction system reached 80° C., 30 cc each of reaction solution was taken out to obtain two kinds of polyamide acid solutions D (cooking process, 2 hours) and E (cooking process, 6 hours).

The reduced viscosity and the solution viscosity of solutions D and E were 0.62 dl/g. and 2,160 cps; 0.46 dl/g. and 1,480 cps, respectively.

Comparison 1

The reaction solution of Example 1 cooked at 85° C. for 7 hours was further cooked at 85° C. for 7 hours to obtain a polyamide acid solution F (cooking process, 14 hours). The reduced viscosity and the solution viscosity were 0.27 dl/g. and 450 cps, respectively.

Comparison 2

For the pyromellitic acid dianhydride of the same component as in Example 1, 12.06 g. of purified pyromellitic acid dianhydride and 1.02 g. of unpurified pyromellitic acid dianhydride were added little by little. 2 Hours after addition, the ice bath was removed and the reaction mixture was stirred for further 3 hours at room temperature to proceed with the reaction, giving a polyamide acid solution G. The reduced viscosity and the solution viscosity were 0.32 dl/g. and 880 cps, respectively.

The thermal weight loss rate of cured film, film thickness when coated on a wafer, and conditions of coated film were examined with respect to the polyamide acids obtained in Examples and Comparisons, and the results are shown in the following Table.

TABLE

|  |  | Example 1 | | | Example 2 | | Comparison 1 | Comparison 2 |
|---|---|---|---|---|---|---|---|---|
|  |  | A | B | C | D | E | F | G |
| First step | Reduced viscosity (dl/g., 30° C.) | 1.08 | | | 0.96 | | 1.08 | 0.32 |
|  | Solution viscosity (cps, 25° C.) | 45,100 | | | 5,920 | | 45,100 | 880 |
| Second step | Reduced viscosity (dl/g., 30° C.) | 0.74 | 0.50 | 0.41 | 0.62 | 0.46 | 0.27 | — |
|  | Solution viscosity (cps, 25° C.) | 2,560 | 1,040 | 760 | 2,160 | 1,480 | 450 | — |
| Resin concentration (wt. %) | | 14.6 | 14.8 | 14.9 | 8.6 | 8.8 | 15.1 | 14.7 |
| Weight loss rate (450° C. 5 hrs., in air) | | 3.33 | 3.87 | 4.20 | 6.09 | 8.27 | 35.43 | 91.02 |
| Film thickness (μm) | | 1.69 | 1.32 | 1.20 | 1.62 | 1.47 | 0.99 | 1.11 |
| Conditions of coated film | | good | good | good | good | good | good | Cracks observed |

Various properties indicated in the Table were measured as follows:

Reduced viscosity 1 g. of a polyamide acid solution was poured into icewater and precipitated. The precipitates were pulverized with a liquidizer, separated by filtration, washed thoroughly with distilled water and dried in vacuo. The thus obtained powder was dissolved in dimethylsulfoxide to make a 0.1 dl/g. solution, of which the viscosity was measured with a Ubbelohde's viscometer in accordance with Japanese Industrial Standard K 5400.

Solution viscosity

Measured with a Brookfield type viscometer in accordance with Japanese Industrial Standard K 6901.

Resin concentration

Measured in accordance with Japanese Industrial Standard C 2103. Sample weight, 1.5 g; heating at 200° C. for 2 hours.

Weight loss rate

The polyamide acid solution was drawn onto a glass plate and heated at 100° C. for 1 hour, then at 200° C. for 1 hour and at 350° C. for 1 hour to prepare a film, of which the weight loss rate was measured after heating at 450° C. for 5 hours in air.

Film thickness

On a 40 φ silicon wafer set on a photoresist rotatory coating machine, about 5 g. of polyamide acid solution was dropped and rotatory-coated for 30 seconds at 4,000 rpm. A cured film was formed on the wafer by heat-processing at 100° C. for 1 hour, then at 200° C. for 1 hour and at 350° C. for 1 hour. The film thickness was measured with a talystep.

Conditions of coated film

Conditions of coated film on the wafer was observed visually through a microscope.

As shown in the foregoing Examples, uniform insulating films having no pin holes caused by runaway and the like and having a good heat-resistance sufficiently with standing heat processing upon preparation of semiconductor apparatus may be obtained and the reliability of semiconductor apparatus may be largely improved by applying the polyamide acid obtained by the method of the invention to semiconductor apparatus.

We claim:

1. A method of preparing polyamide acid useful for processing of semi-conductors from (i) at least one diamine and (ii) a tetracarboxylic acid dianhydride and a diaminocarbonamide in an inert solvent, which comprises the steps of
   (1) reacting (i) at least one diamine and (ii) at least one tetracarboxylic acid dianhydride and at least one diaminocarbonamide, at a temperature below 40° C. to form a polyamide acid having a reduced viscosity above 0.5 dl/g at 30° C., and
   (2) heating said polyamide acid in an inert solvent at a temperature between 50° C. and 100° C. to lower the viscosity of said polyamide acid whereby the reduced viscosity of said polyamide acid is more than 0.3 dl/g at 30° C. and the solution viscosity of said polyamide acid in the inert solvent is 500 to 3,000 centipoises at 25° C., the reduced viscosity being measured by forming a 0.1 dl/g solution of said polyamide acid in dimethylsulfoxide and measuring the viscosity of the solution with a Ubbelohde's viscometer in accordance with Japanese Industrial Standard K 5400, and the solution viscosity being measured by measuring the viscosity of the solution of said polyamide acid in dimethylsulfoxide with a Brookfield type viscometer in accordance with Japanese Industrial Standard K 6901.

2. The method of claim 1, wherein the reaction of said diamine to form said polyamide acid is carried out until said reduced viscosity at 30° C. reaches above 0.7 dl/g in the first step of said method, and wherein said polyamide acid is heated to lower the reduced viscosity to between 0.35 and 0.45 dl/g and the solution viscosity to between 800 and 1,500 centipoises at 25° C. in said second step of said method.

3. The method of claim 2, wherein
said diamine is selected from the group consisting of 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine and 2,6-naphthalenediamine;

said tetracarboxylic acid dianhydride is selected from the group consisting of pyromellitic acid dianhydride, 3,3'4,4'-diphenyltetracarboxylic acid dianhydride, 3,3',4,4'-benzophenonetetracarboxylic acid dianhydride, cyclopentanetetracarboxylic acid dianhydride, 1,2,5,6-naphthalenetetracarboxylic acid dianhydride, 2,3,6,7-naphthalenetetracarboxylic acid dianhydride, 2,3,5,6-pyridinetetracarboxylic acid dianhydride, 1,4,5,8-naphthalenetetracarboxylic acid dianhydride, 3,4,9,10-perylenetetracarboxylic acid dianhydride and 4,4'-sulfonyldiphthalic acid dianhydride; and said diaminocarbonamide is selected from the group consisting of 4,4'-diaminodiphenyl ether-3-carbonamide, 3,4'-diaminodiphenyl ether-4-carbonamide, 3,4-diaminodiphenyl ether-3'-carbonamide, 3,3'-diaminodiphenyl ether-4-carbonamide, 4,4'-diaminodiphenylmethane-3-carbonamide, 3,4'-diaminodiphenylmethane-4-carbonamide, 3,4'-diaminodiphenylmethane-3'-carbonamide, 3,3'-diaminodiphenylmethane-4-carbonamide, 4,4'-diaminodiphenyl sulfone-3-carbonamide, 3,4'-diaminodiphenyl sulfone-4-carbonamide, 3,4'-diaminodiphenyl sulfone-3'-carbonamide, 3,3'-diaminodiphenyl sulfone-4-carbonamide, 4,4'-diaminodiphenyl sulfide-3-carbonamide, 3,4'-diaminodiphenyl sulfide-4-carbonamide, 3,3'-diaminodiphenyl sulfide-4-carbonamide, 3,4'-diaminodiphenyl sulfide-3'-carbonamide and 1,4-diaminobenzene-2-carbonamide.

4. The method of claim 2, wherein 4,4'-diaminodiphenylether, 4,4'-diaminodiphenylether-3-carbonamide, pyromellitic acid dianhydride and 3,3',4,4'-benzophenonetetracarboxylic acid dianhydride are reacted in the reaction step (1).

5. The polyamide acid produced by the process of claim 2.

6. The polyamide acid produced by the process of claim 3.

7. The polyamide acid produced by the process of claim 4.

* * * * *

UNITED STATES PATENT AND TRADEMARK OFFICE
CERTIFICATE OF CORRECTION

PATENT NO. : 4,485,234

DATED : November 27, 1984

INVENTOR(S) : Daisuke MAKINO

It is certified that error appears in the above-identified patent and that said Letters Patent is hereby corrected as shown below:

Column 1, line 65:  After "from" insert --the--.

Column 2, line 55:  In the right margin of the structural formula, the "n" should be --m--.

Column 4, line 23:  "1μ" should be --1 μm--.

Column 5, line 5:   "50° -∅° C." should be -- 50-100°C. --.

Signed and Sealed this

Eighteenth Day of June 1985

[SEAL]

Attest:

DONALD J. QUIGG

Attesting Officer    Acting Commissioner of Patents and Trademarks